United States Patent
Chen et al.

(10) Patent No.: US 11,869,816 B2
(45) Date of Patent: Jan. 9, 2024

(54) LED PACKAGE WITH MULTIPLE TEST PADS AND PARALLEL CIRCUIT ELEMENTS

(71) Applicant: EXCELLENCE OPTO. INC., Miaoli County (TW)

(72) Inventors: Fu-Bang Chen, Miaoli County (TW); Chih-Chiang Chang, Miaoli County (TW); Chang-Ching Huang, Miaoli County (TW); Chun-Ming Lai, Miaoli County (TW); Wen-Hsing Huang, Miaoli County (TW); Tzeng-Guang Tsai, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 294 days.

(21) Appl. No.: 17/385,101

(22) Filed: Jul. 26, 2021

(65) Prior Publication Data

US 2023/0021896 A1 Jan. 26, 2023

(51) Int. Cl.
| | |
|---|---|
| H01L 21/66 | (2006.01) |
| H01L 25/075 | (2006.01) |
| H01L 33/62 | (2010.01) |
| H01L 29/866 | (2006.01) |
| H01L 33/52 | (2010.01) |
| H01L 25/16 | (2023.01) |

(52) U.S. Cl.
CPC .......... H01L 22/32 (2013.01); H01L 25/0753 (2013.01); H01L 25/167 (2013.01); H01L 29/866 (2013.01); H01L 33/52 (2013.01); H01L 33/62 (2013.01)

(58) Field of Classification Search
CPC ... H01L 22/32; H01L 25/0753; H01L 25/167; H01L 29/866; H01L 33/52; H01L 33/62
See application file for complete search history.

(56) References Cited

U.S. PATENT DOCUMENTS

| | | | |
|---|---|---|---|
| 8,183,579 B2 | 5/2012 | Wang | |
| 8,319,250 B2 | 11/2012 | Rode et al. | |
| 8,546,831 B1 | 10/2013 | Chen et al. | |
| 2013/0092960 A1* | 4/2013 | Wilcox | H01L 25/0753 257/88 |
| 2018/0174932 A1* | 6/2018 | Cok | H01L 22/22 |
| 2020/0203235 A1* | 6/2020 | Jung | H01L 22/32 |
| 2020/0373471 A1* | 11/2020 | Lin | H01L 25/167 |

(Continued)

*Primary Examiner* — Victor A Mandala
(74) *Attorney, Agent, or Firm* — MUNCY, GEISSLER, OLDS & LOWE, P.C.

(57) ABSTRACT

A package substrate comprises first, second and third electrical test contacts, wherein the package substrate is provided with an upper element plane and a lower SMD electrode plane on two sides. The side edge of the upper element plane is provided with first and second electrodes of the main element and first and second electrodes of the secondary element. The main element of LED chip is electrically connected between the first and second electrodes of the main element, a parallel circuit secondary element is electrically connected between the first and second electrodes of the secondary element. The electrical characteristics of the main element of LED chip and the parallel circuit secondary element are measured through the first, second, and third electrical test contacts when electrically connected.

19 Claims, 10 Drawing Sheets

(56) References Cited

U.S. PATENT DOCUMENTS

| | | | |
|---|---|---|---|
| 2020/0402943 A1* | 12/2020 | Hien | H01L 25/0753 |
| 2021/0123967 A1* | 4/2021 | Liao | G01R 31/2635 |
| 2021/0183833 A1* | 6/2021 | Hu | H01L 33/62 |
| 2021/0193790 A1* | 6/2021 | Hu | H01L 27/124 |
| 2022/0093551 A1* | 3/2022 | Huang | H01L 25/167 |
| 2022/0123188 A1* | 4/2022 | Chen | H01L 25/167 |
| 2022/0209083 A1* | 6/2022 | Lin | H01L 25/0753 |
| 2023/0023295 A1* | 1/2023 | Chen | H01L 33/62 |

\* cited by examiner

LED PACKAGE WITH MULTIPLE TEST PADS AND PARALLEL CIRCUIT ELEMENTS

FIELD OF THE INVENTION

The invention relates to an LED package structure, in particular to an LED package with multiple test pads and a parallel circuit elements.

BACKGROUND OF THE INVENTION

A light-emitting diode (LED) is a light source which can generate high brightness by combining electron holes of a semiconductor. LED products are applied to high-luminosity sterilization (ultraviolet light), automotive headlights and taillights (blue-yellow-red light), projector light source (blue-green-red), and infrared security detection (infrared), etc. Excellent high-power LED elements not only have high luminosity and luminous density, but also need to be highly reliable. Taking an automotive headlamp module as an example, once an LED malfunctions, night safety could be affected. According to the high standard specification of automotive LEDs, a failure as small as 1 ppm needs to be treated in the automotive industry.

LEDs are divided into multiple types according to different chip structures. In addition to low-cost horizontal chips, flip-chip and vertical high-power LED chips with high process complexity are also developed from high-power and large-size chips. For example, U.S. Pat. No. 8,183,579 B2 discloses a flip-chip type LED chip structure. For another example, U.S. Pat. No. 8,546,831 discloses a vertical LED chip structure. For another example, U.S. Pat. No. 8,319,250 discloses a multi-conductive pillar technology using a vertical LED. An N electrode serves as a bottom electrode and extends a plurality of vertical conductive pillars with insulated side walls through a P-type semiconductor layer and a quantum well layer, and into an N-type semiconductor layer to disperse the working current uniformly into the N-type semiconductor layer. A P electrode is provided with side edges for wire bonding in a packaging process.

At present, the main failure mode of LEDs is leakage current caused by wafer defects. Besides, during the packaging process, a semiconductor part of an LED pulls a semiconductor layer due to the stress resulting from chip bonding and an electrode conduction process; or the thermal stress in a high temperature process, or the pull of a packaging adhesive material causes micro cracks or stripping of a thin film, which results in greater leakage current, leading to a package failure or reliability reduction.

FIG. 1 is a circuit diagram of a conventional package. FIG. 2 is a cross-sectional view of a conventional LED package structure. As an LED chip 1 is packaged in an SMD, a P electrode 2 is bonded to a chip bonding layer 4 of a package substrate 3 through a chip bonding adhesive layer 4A. An N electrode 5 electrically connects a gold wire 6 to a wire bonding pad 7 by wire bonding, and the chip bonding layer 4 and the wire bonding pad 7 are respectively electrically connected to an anode 9A and a cathode 9B which are located on the other side of the package substrate 3 through conductive metal 8. The LED chip 1 can be connected in parallel circuit with a Zener diode 1A to prevent element damage caused by strong static electricity.

In order to meet the requirement of high reliability, the packaged LED chip 1 are tested with a testing instrument by using the anode 9A and the cathode 9B as test contacts to meet the high standard specification of automotive LEDs.

When testing the LED chip 1, a serious failure of an element is found through forward voltage Vf and brightness as the element malfunctions. However, micro cracks of a semiconductor are only known from reverse bias characteristics (such as Ir). As the LED chip 1 is connected in parallel circuit with the Zener diode 1A, electrical characteristics (such as leakage current Ir) under reverse bias are barely measured. Only photoelectric characteristics (such as brightness, wavelength and Vf) under forward bias operation are measured, thus reducing the reliability detectability of the LED chip 1.

Except for the Zener diode 1A connected in parallel circuit, other parallel circuit secondary element in the circuit may interfere with the electrical measurement of the LED chip 1. If the leakage current of the LED chip 1 under the reverse bias condition is barely accurately measured, the evaluation of the reliability and aging testing of the LED chip 1 after the packaging process may encounter great obstacles.

SUMMARY OF THE INVENTION

The main purpose of the invention relates to a LED package with multiple test pads and a parallel circuit element. The electrical characteristics of a main element of LED chip and a parallel circuit secondary element are measured after the chip bonding of the main element of LED chip and the parallel circuit secondary element.

The invention comprises a LED package with multiple test pads and a parallel circuit element, which is used for chip bonding of a main element of LED chip and a parallel circuit secondary element. The invention comprises a package substrate, a first electrical test contact, a second electrical test contact, and a third electrical test contact. The package substrate is provided with an upper element plane and a lower SMD electrode plane on two sides. The upper element plane is provided with a first electrode of the main element, a second electrode of the main element, a first electrode of the secondary element, and a second electrode of the secondary element. The first electrode of the main element and the second electrode of the main element are electrically connected to the main element of LED chip. The first electrode of the secondary element and the second electrode of the secondary element are electrically connected to the parallel circuit secondary element. In different implementation structures, the electrical connection manner could be chip bonding, wire bonding, etc., to maintain its electrical connection. The first electrode of the main element electrically communicates with the first electrode of the secondary element.

The first electrical test contact is arranged on the package substrate and electrically connected to the first electrode of the main element and the first electrode of the secondary element. The second electrical test contact is arranged on the package substrate and electrically connected to the second electrode of the secondary element. The third electrical test contact is arranged on the package substrate and electrically connected to the second electrode of the main element.

Therefore, the first electrode of the main element and the second electrode of the main element could be used for chip bonding of the main element of LED chip, and the first electrode of the secondary element and the second electrode of the secondary element could be used for chip bonding of the parallel circuit secondary element. As the main element of LED chip and the parallel circuit secondary element are connected with the important structures, the electrical characteristics of the main element of LED chip and the parallel circuit secondary element are measured through the first, second and, third electrical test contacts. Then, the second and third electrical test contacts are connected through a simple and safe process to maintain the reliability of the main element of LED chip.

DETAILED DESCRIPTION OF THE PREFERRED EMBODIMENTS

Figure 1:
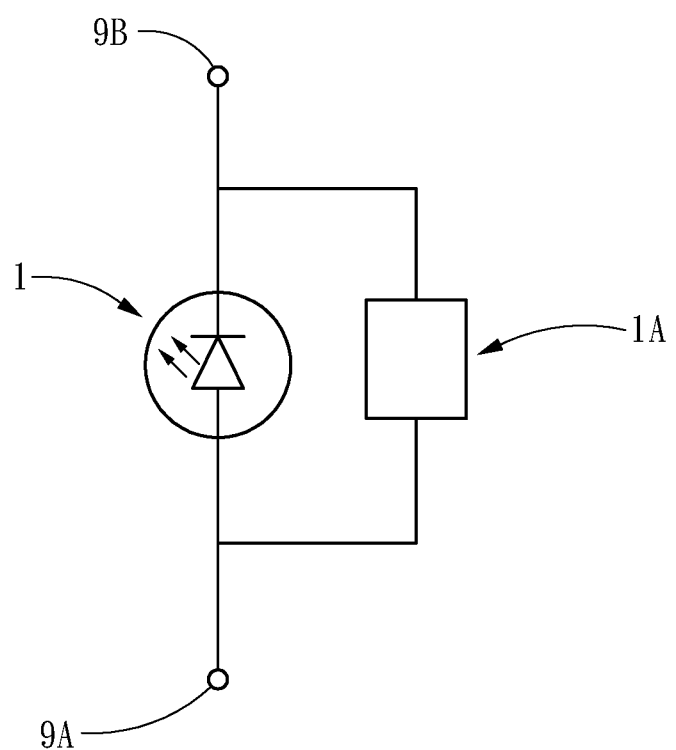
FIG. 1 is a circuit diagram of a conventional package.
Figure 2:
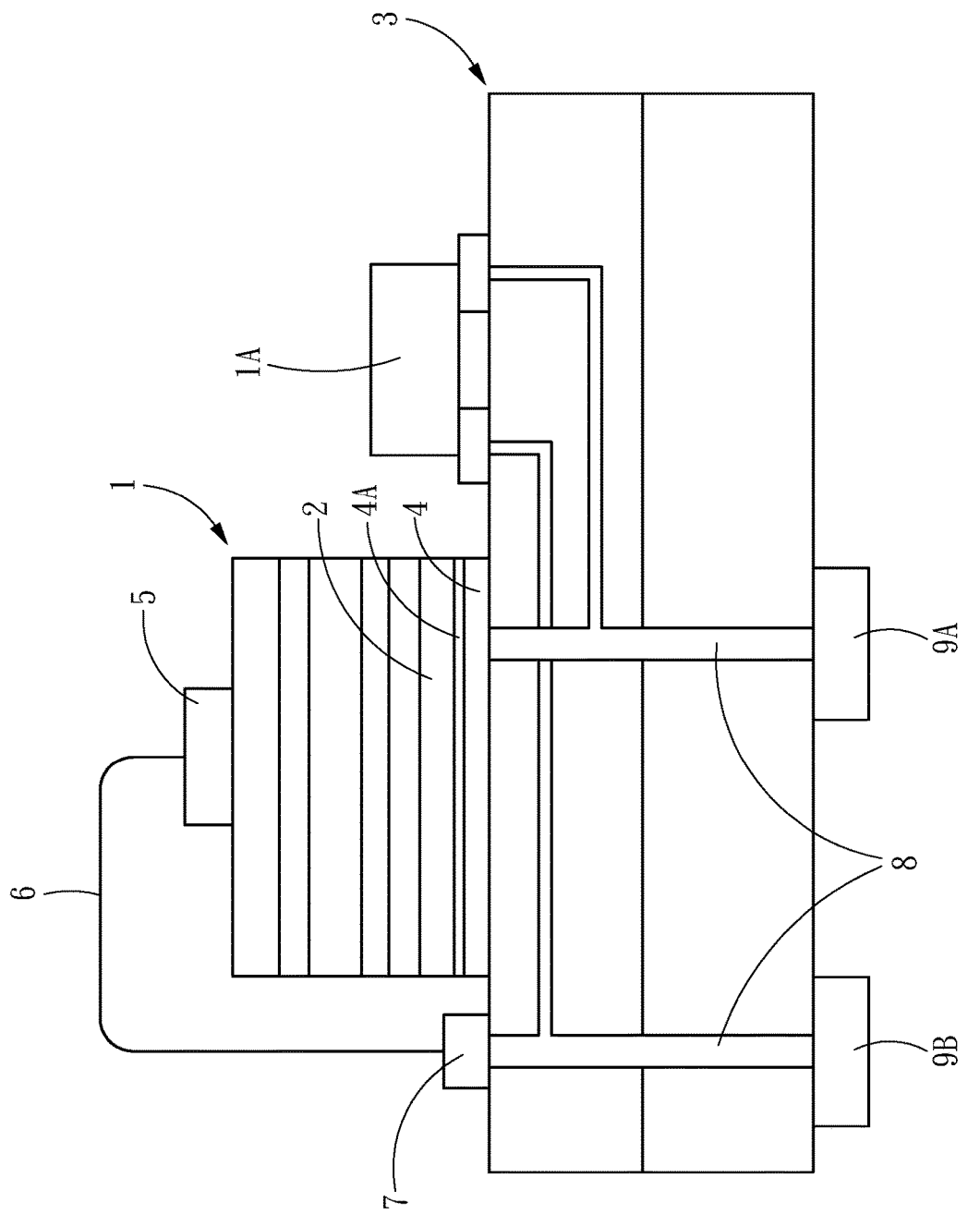
FIG. 2 is a cross-sectional view of a conventional LED package structure.
Figure 3:
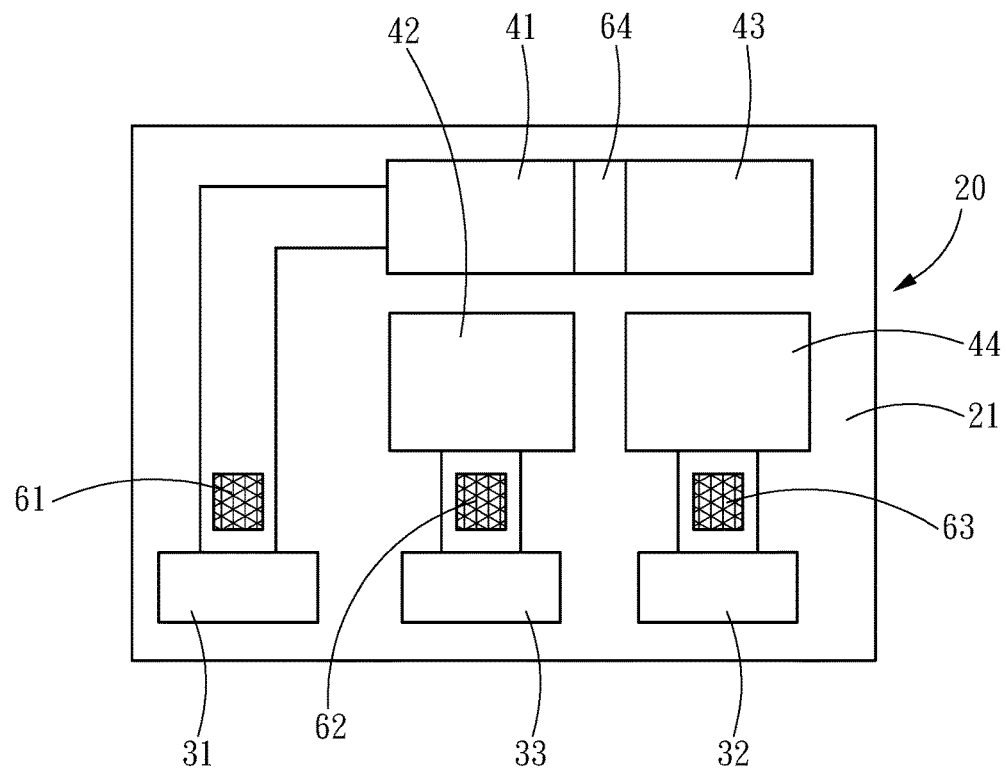
FIG. 3 is a schematic diagram of a front structure of a package substrate of the invention.
Figure 4:
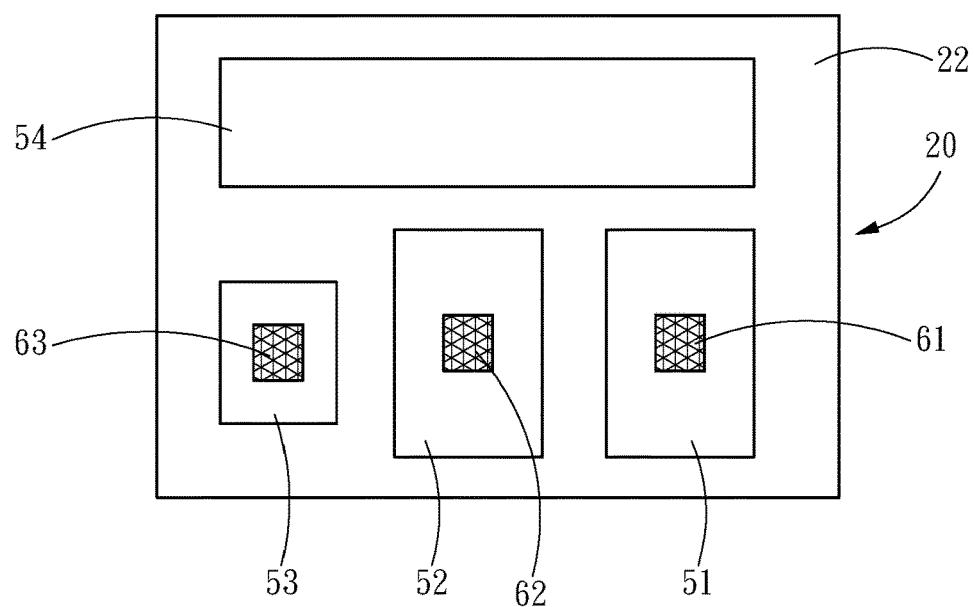
FIG. 4 is a schematic diagram of a back structure of a package substrate of the invention.
Figure 5:
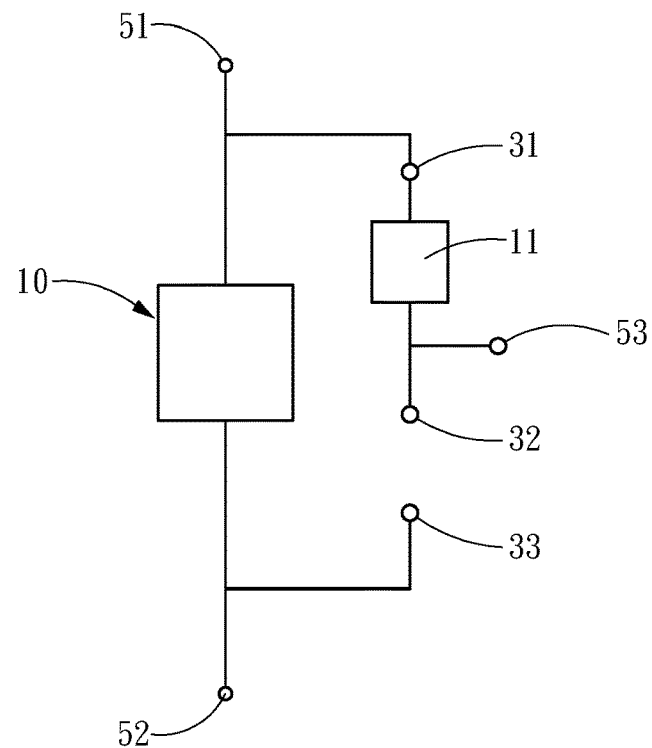
FIG. 5 is a circuit diagram of a package structure of the invention.

In order to allow a deeper understanding and recognition of the features, purposes and effects of the present invention, a preferred embodiment is listed and explained with the accompanying drawings as follows:

Please refer to FIG. 3, FIG. 4 and FIG. 5, the invention is an LED package with multiple test pads and a parallel circuit element, which is used for chip bonding of a main element of LED chip 10 and a parallel circuit secondary element 11. The invention comprises a package substrate 20, a first electrical test contact 31, a second electrical test contact 32 and a third electrical test contact 33.

Figure 6:
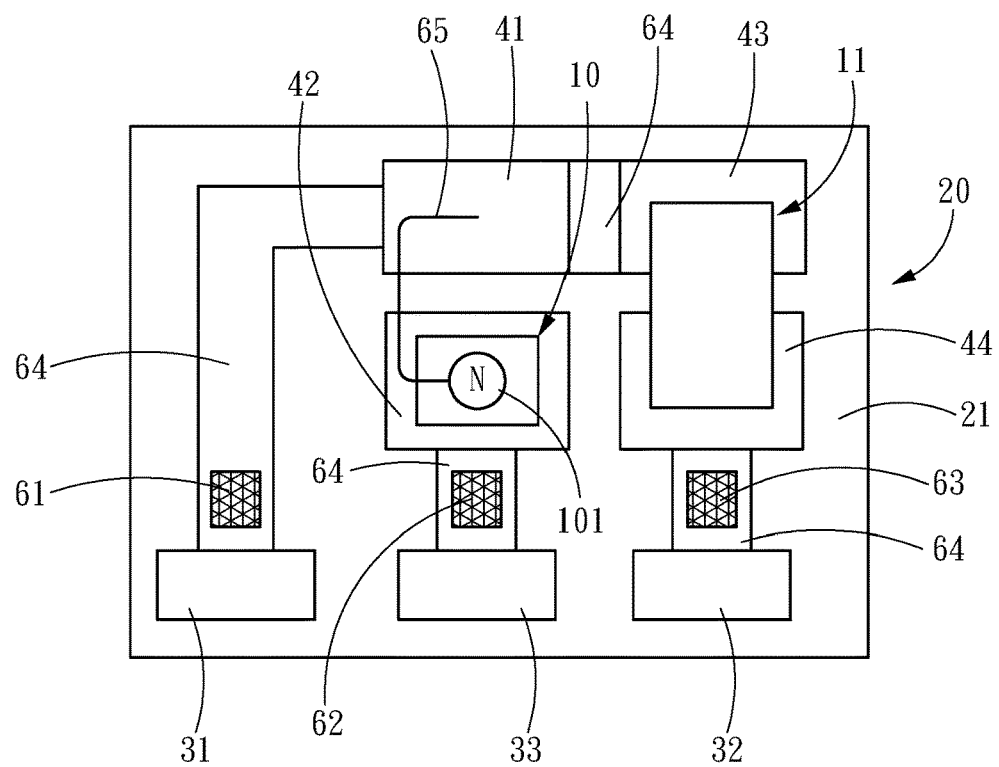
FIG. 6 is a schematic diagram of a front structure of a package substrate according to an embodiment of the invention.
Figure 7:
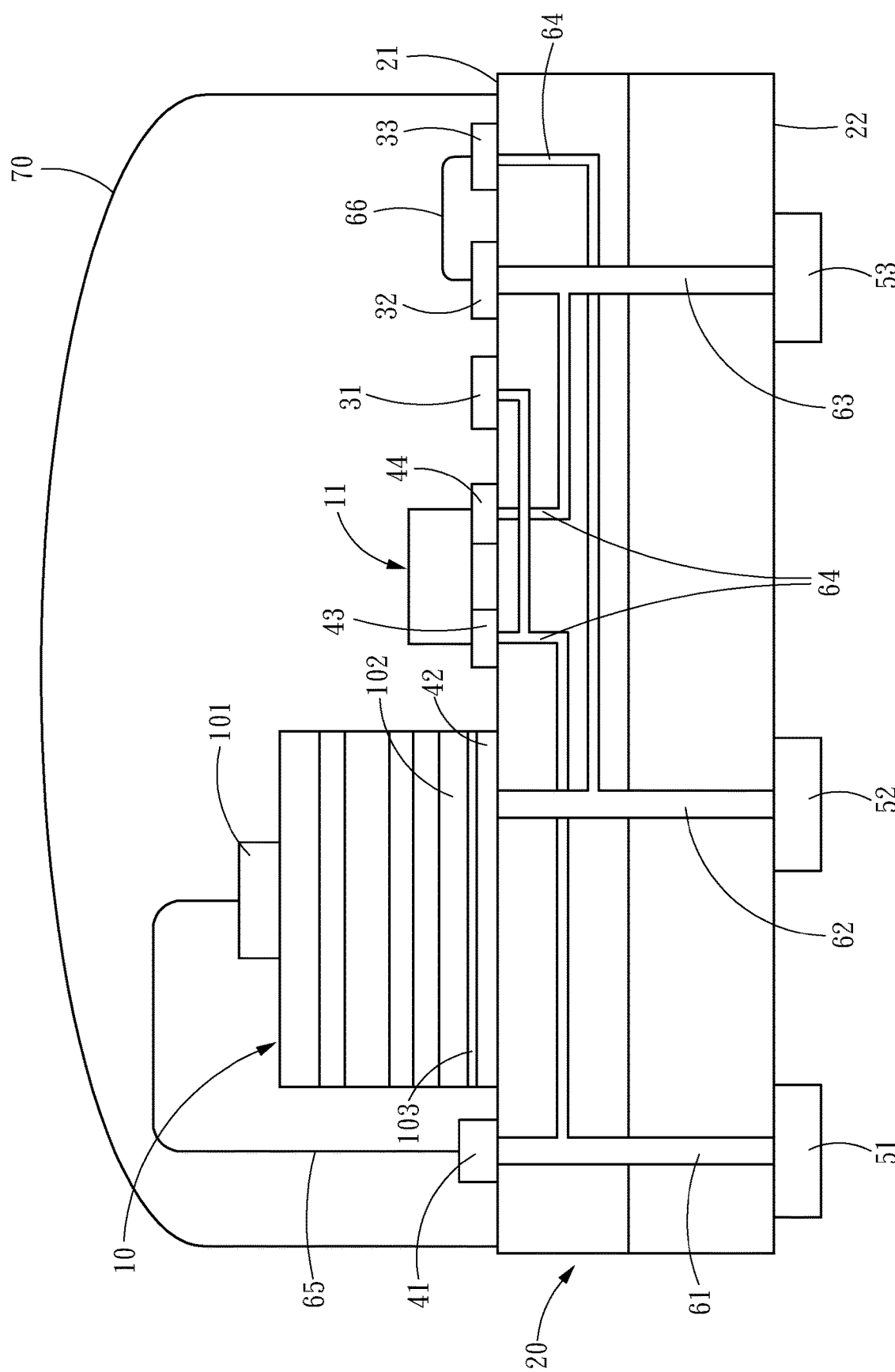
FIG. 7 is a cross-sectional view of a package structure according to an embodiment of the invention.

Please refer to FIG. 6 and FIG. 7, the package substrate 20 is provided with an upper element plane 21 and a lower SMD electrode plane 22 located on two sides. The upper element plane 21 is provided with a first electrode of the main element 41, a second electrode of the main element 42, a first electrode of the secondary element 43 and a second electrode of the secondary element 44. The first electrode of the main element 41 and the second electrode of the main element 42 are used for chip bonding of the main element of LED chip 10, the first electrode of the secondary element 43 and the second electrode of the secondary element 44 are used for chip bonding of the parallel circuit secondary element 11, and the first electrode of the main element 41 is electrically connected with the first electrode of the secondary element 43.

The first electrical test contact 31 disposed on the package substrate 20 is electrically connected to the first electrode of the main element 41 and the first electrode of the secondary element 43. The second electrical test contact 32 disposed on the package substrate 20 is electrically connected to the second electrode of the secondary element 44. The third electrical test contact 33 disposed on the package substrate 20 is electrically connected to the second electrode of the main element 42.

In an actual structure, the package substrate 20 could be a ceramic substrate (aluminum nitride, aluminum oxide, silicon carbide), a copper substrate, a BT (Bismaleimide Triazine) substrate, etc. The package substrate 20 could be a single-layer board or a multi-layer board. The first electrical test contact 31, the second electrical test contact 32, and the third electrical test contact 33 are arranged on the upper element plane 21. The lower SMD electrode plane 22 is provided with a first substrate external electrode 51, a second substrate external electrode 52, and a substrate relay electrode 53. The first substrate external electrode 51 is electrically connected through a first electrode via hole 61 to the first electrode of the main element 41, the first electrode of the secondary element 43, and the first electrical test contact 31. The second substrate external electrode 52 is electrically connected through a second electrode via hole 62 to the second electrode of the main element 42 and the third electrical test contact 33. The substrate relay electrode 53 is electrically connected through a substrate relay electrode via hole 63 to the second electrode of the secondary element 44 and the second electrical test contact 32. In addition, the lower SMD electrode plane 22 could be provided with a raised layer 54 (as shown in FIG. 4). The height of the raised layer 54 is as high as the first substrate external electrode 51, the second substrate external electrode 52, and the substrate relay electrode 53 to meet the requirements of subsequent processes.

In addition, the first electrical test contact 31, the first electrode of the main element 41, and the first electrode of the secondary element 43 are electrically connected through a metal conductive layer 64 buried in the package substrate 20 (as shown in FIG. 7). The second electrical test contact 32 and the second electrode of the secondary element 44 are electrically connected through the metal conductive layer 64 buried in the package substrate 20. The third electrical test contact 33 and the second electrode of the main element 42 are electrically connected through the metal conductive layer 64 buried in the package substrate 20 (as shown in FIG. 7). The metal conductive layer 64 are formed on the upper element plane 21 of the package substrate 20 (as shown in FIG. 6).

The main element of LED chip 10 of the invention could be any one selected from a horizontal LED, a flip-chip LED, a vertical LED, or a multi-conductive pillar vertical LED (such as U.S. Pat. No. 8,319,250), and the main element of LED chip 10 could be a single LED chip or a plurality of LED chips connected in series to increase the brightness. The cross section of the package structure of the invention, as shown in FIG. 7, the main element of LED chip 10 is a vertical LED. A N-type electrode 101 is located on the uppermost of the main element of LED chip 10, while a P-type electrode 102 is located on the lowermost of the main element of LED chip 10. The P-type electrode 102 is chip-bonded on the electrode of the second electrode of the main element 42 through a substrate chip-bonding layer 103, and the N-type electrode 101 is wire-bonded to the first electrode of the main element 42 through a gold wire 65. The parallel circuit secondary element 11 is selected from a Zener diode, a capacitor, or an LED chip to meet different functional requirements. If the parallel circuit secondary element 11 is an LED chip, the value of the forward voltage (Vf) of the parallel circuit secondary element 11 should be close to the one of the forward voltage (Vf) of the main element of LED chip 10. If the parallel circuit secondary element 11 is a Zener diode, a bi-directional Zener diode could be selected, and a unidirectional Zener diode could be selected as well. If a unidirectional Zener diode is selected, the parallel circuit secondary element 11 needs to be connected in parallel with the main element of LED chip 10 in opposite polarity manner.

As shown in FIG. 5, the LED package structure circuit has three test contacts, namely, the first electrical test contact 31, the second electrical test contact 32, and the third electrical test contact 33. The first electrical test contact 31 and the second electrical test contact 32 are used to test whether the electrical characteristics of the parallel circuit secondary element 11 are normal. The first electrical test contact 31 and the third electrical test contact 33 are used to measure the small current forward voltage Vf of the main element of LED chip 10 and the accurate value of the leakage current of the main element of LED chip 10 under the reverse bias condition in the presence of the parallel circuit secondary element second element 11. The causes of the reverse bias leakage current include the expansion of semiconductor defects, aging in a high temperature furnace, and ESD tests, etc.

After the test is finished, the second electrical test contact 32 and the third electrical test contact 33 could be electrically connected through a conductive metal 66. The conductive metal 66 could be formed by using a gold wire in the wire bonding process or by using a semiconductor thin film.

In addition, in order to protect the elements on the package substrate 20, after the test is finished, as shown in FIG. 7, the invention comprises a packaging material 70. The packaging material 70 covers the upper element plane 21 of the package substrate 20, thus protecting the elements on the package substrate 20, such as the main element of LED chip 10, the first electrical test contact 31, the second electrical test contact 32, the third electrical test contact, the first electrode of the main element 41, the second electrode of the main element 42, the first electrode of the secondary element 43, and the second electrode of the secondary element 44.

Figure 8:
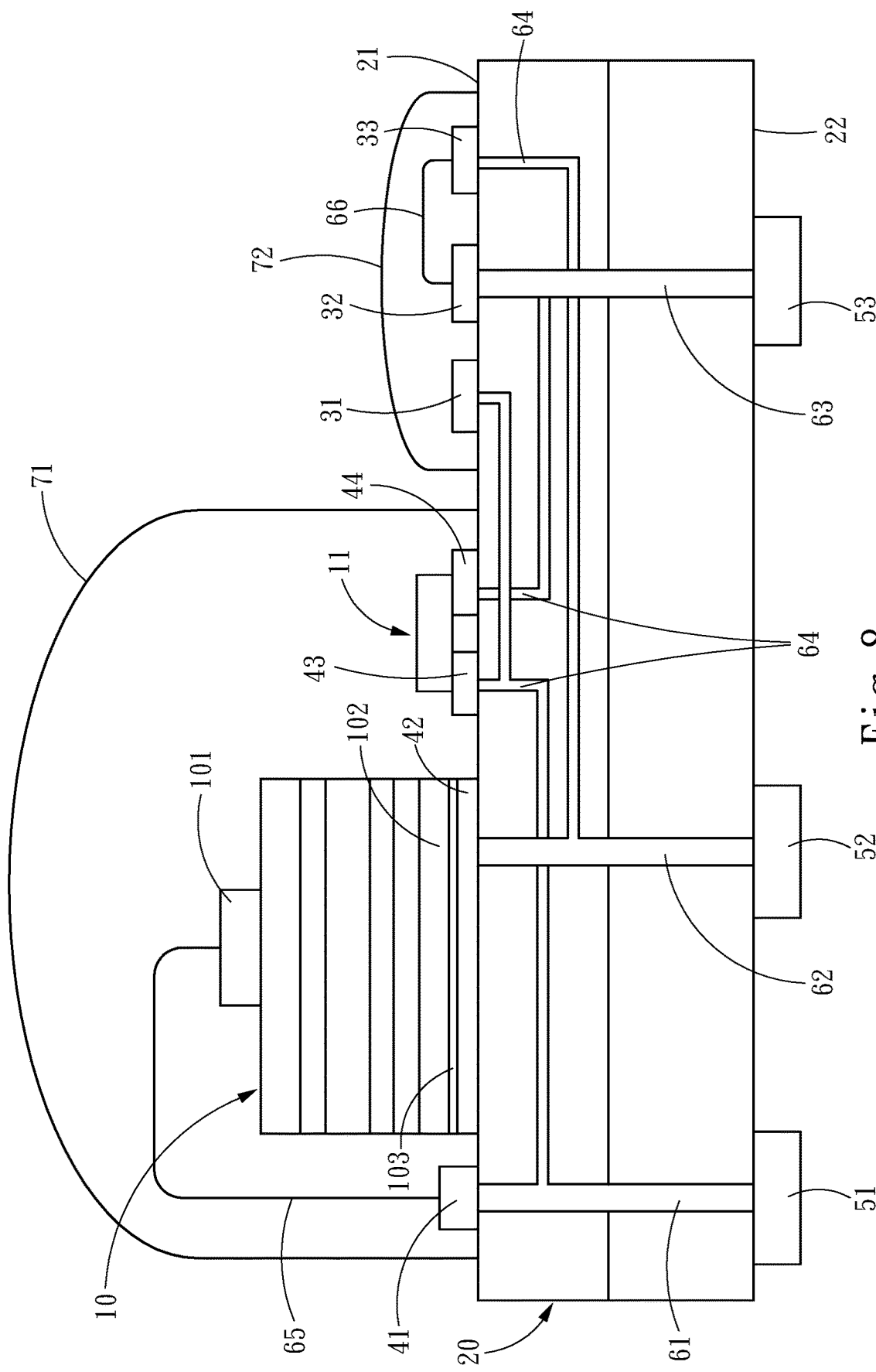
FIG. 8 is a cross-sectional view of another package structure according to an embodiment of the invention.

Please refer to FIG. 8, in another embodiment, the invention comprises a first packaging material 71 and a second packaging material 72. The main element of LED chip 10, the parallel circuit second element 11, the first electrode of the main element 41, the second electrode of the main element 42, the first electrode of the secondary element 43, and the second electrode of the secondary element 44 are covered by the first packaging material 71.

Then, the first electrical test contact 31, the second electrical test contact 32, and the third electrical test contact 33 which are not packaged are used for testing. The problem in the packaging process of the prior art that the gold wire 65 is pulled by the packaging material to indirectly pull and damage the main element of LED chip 10, resulting in the failure or instability of the main element of LED chip 10 caused by micro cracks or film peeling is solved.

After the test is finished, the second electrical test contact 32 and the third electrical test contact 33 are electrically connected through the conductive metal 66. Finally, the second packaging material 72 covers the conductive metal 66, the first electrical test contact 31, the second electrical test contact 32, and the third electrical test contact 33, thus completing the whole packaging process. If the main element of LED chip 10 malfunctions, the second packaging material 72 could be detached separately, and the connecting wire 66 could be removed or be open-circuit, which will barely damage the main element of LED chip 10. Then, a retest could be conducted to find out the real cause of the elements failure easily and effectively.

Figure 9:
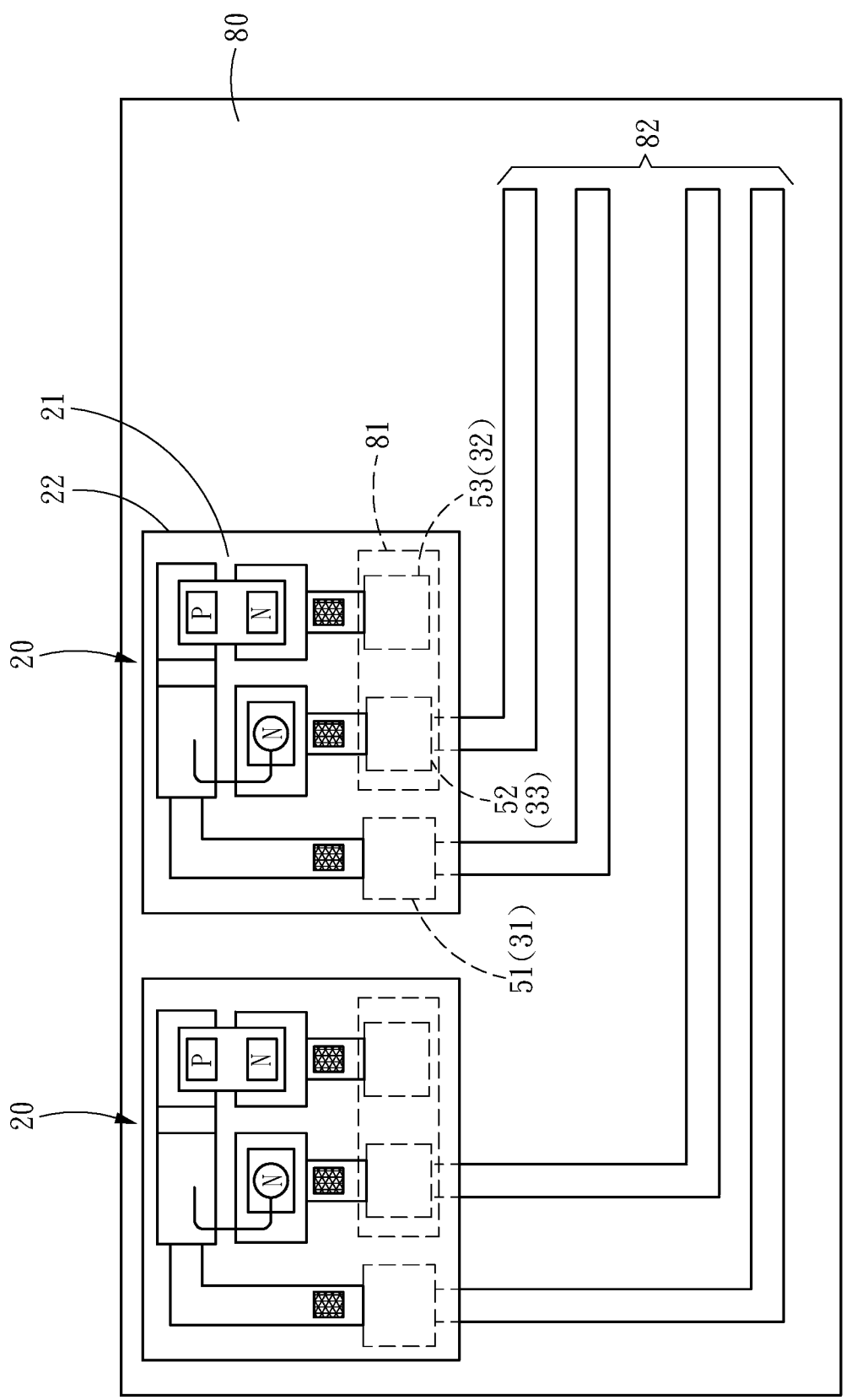
FIG. 9 is a first diagram of circuit connection according to an embodiment of the invention.

Please refer to FIG. 9, in one embodiment, the first electrical test contact 31, the second electrical test contact 32, and the third electrical test contact 33 are disposed on the lower SMD electrode plane 22 of the package substrate 20. In an actual structure, the first substrate external electrode 51 is directly used as the first electrical test contact 31, the substrate relay electrode 53 as the second electrical test contact 32, and the second substrate external electrode 52 as the third electrical test contact 33. After the test is finished, the lower SMD electrode plane 22 of the package substrate 20 covers a circuit substrate 80. The second substrate external electrode 52 and the substrate relay electrode 53 are electrically connected by a solder paste 81 at the lower SMD electrode plane 22. In this way, the package substrates 20 are arranged in parallel, and in this structure, the circuit substrate 80 comprises a plurality of circuit board extension electrodes 82 electrically connected to the first substrate external electrodes 51 and the second substrate external electrodes 52 of the package substrates 20 to meet the use requirements of subsequent processes.

Figure 10:
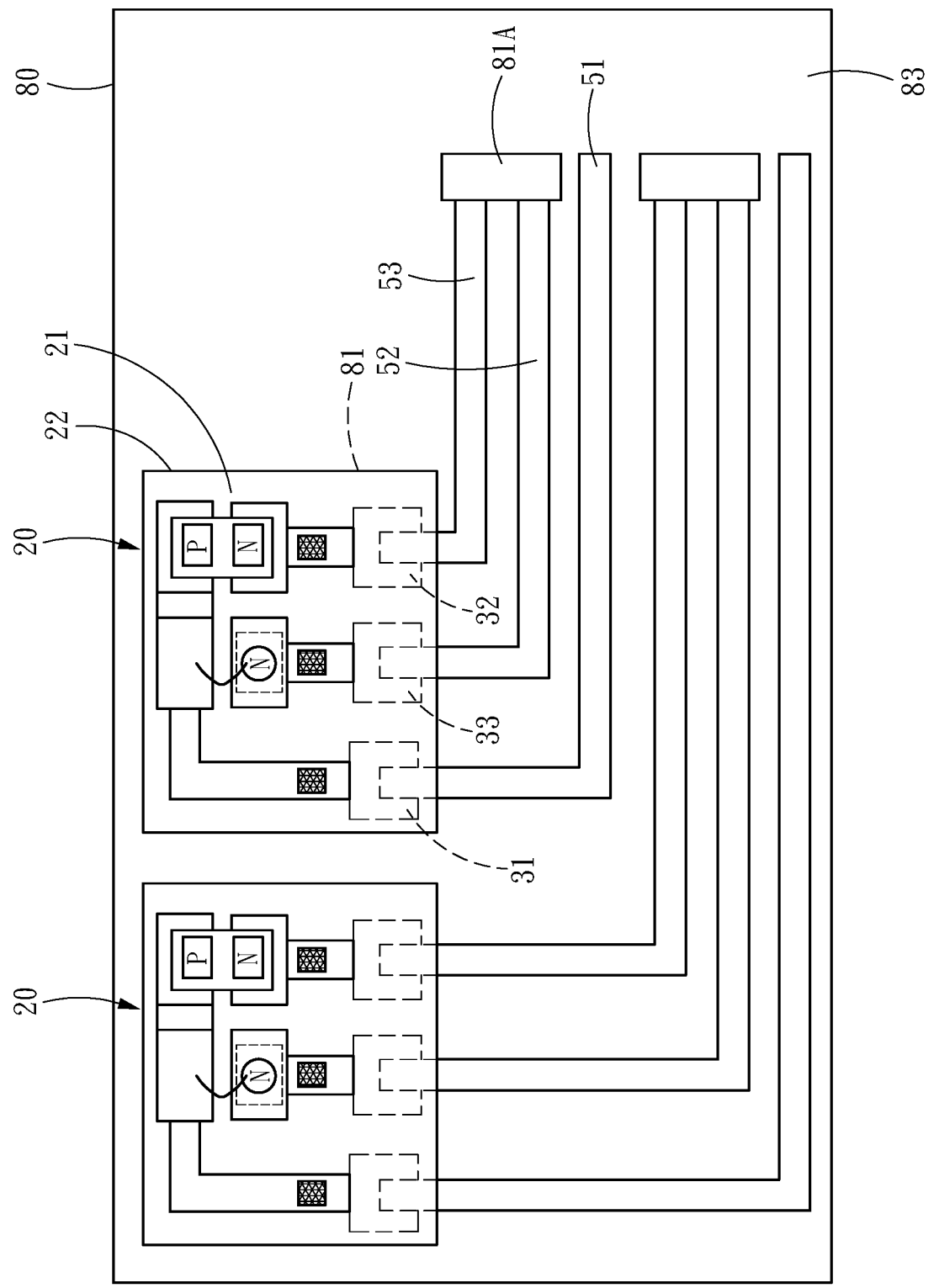
FIG. 10 is a second diagram of circuit connection according to an embodiment of the invention.

Please refer to FIG. 10, in one embodiment, the first substrate external electrode 51, the second substrate external electrode 52, and the substrate relay electrode 53 are located at a circuit board upper plane 83 of the circuit substrate 80. The second substrate external electrode 52 and the substrate relay electrode 53 are electrically connected by a conductive thin film 81A at the circuit board upper plane 83.

In the above-mentioned embodiments, the main element of LED chip 10 is a vertical LED. The invention could be applied to a flip-chip LED, a multi-conductive pillar vertical LED, etc., which will be described as follows.

Figure 11:
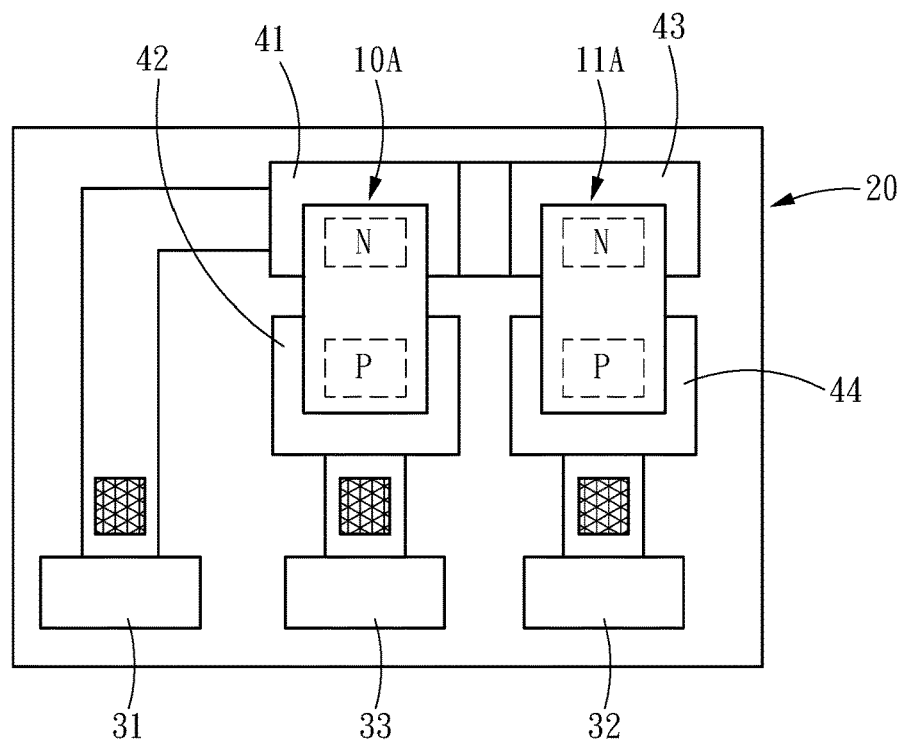
FIG. 11 is a structural diagram of a package substrate according to another embodiment of the invention.

Please refer to FIG. 11, as the main element of LED chip 10A is a flip-chip LED and the parallel circuit secondary element 11A is a flip-chip LED, the main element of LED chip 10A and the parallel circuit secondary element 11A are chip-bonded on the package substrate 20 in a flip-chip mounting mode.

Figure 12:
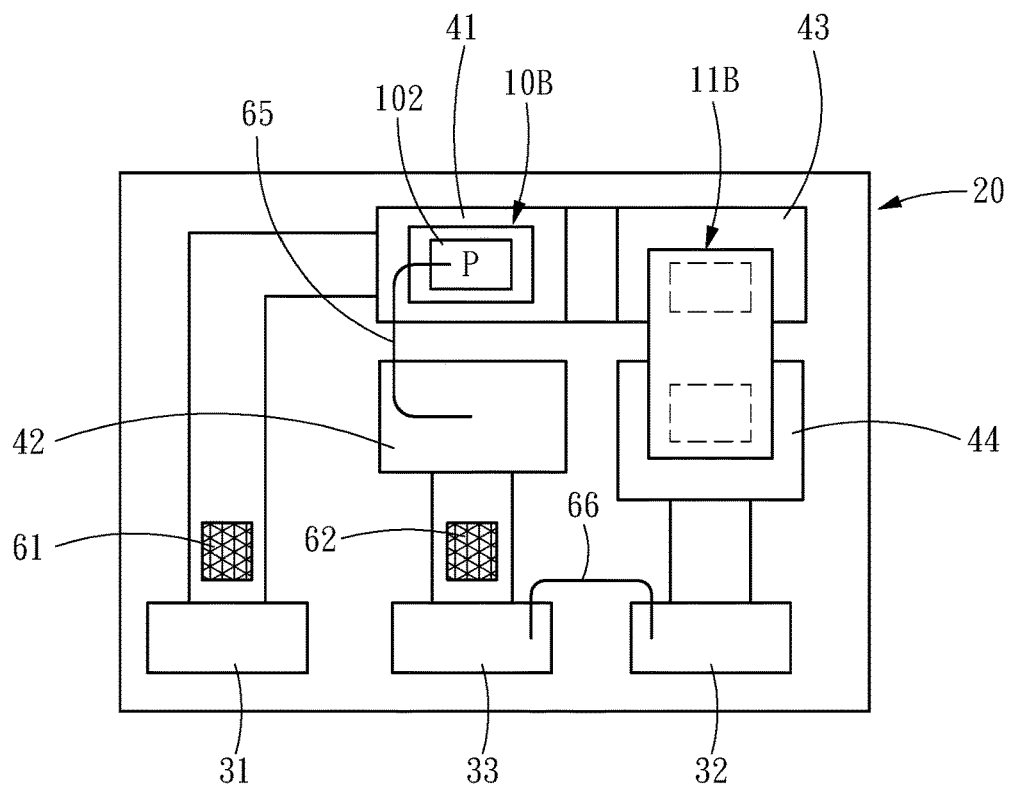
FIG. 12 is a structural diagram of a package substrate according to another embodiment of the invention.

Please refer to FIG. 12, as the main element of LED chip 10B is a multi-conductive pillar vertical LED and the parallel circuit secondary element 11B is a capacitor, the N-type electrode (located at the bottom, not shown) of the main element of LED chip 10B could be chip-bonded to the first electrode of the main element 41, and then the P-type electrode 102 of the main element of LED chip is electrically connected to the second electrode of the main element 42 through the gold wire 65 by wire bonding. As shown in FIG. 12, only the first electrode via hole 61 and the second electrode via hole 62 are provided. The second electrical test contact 32 and the third electrical test contact 33 are electrically connected through the conductive metal 66 (wire bonding or metal thin film) after testing, so the substrate relay electrode via hole 63 could be omitted.

Figure 13:
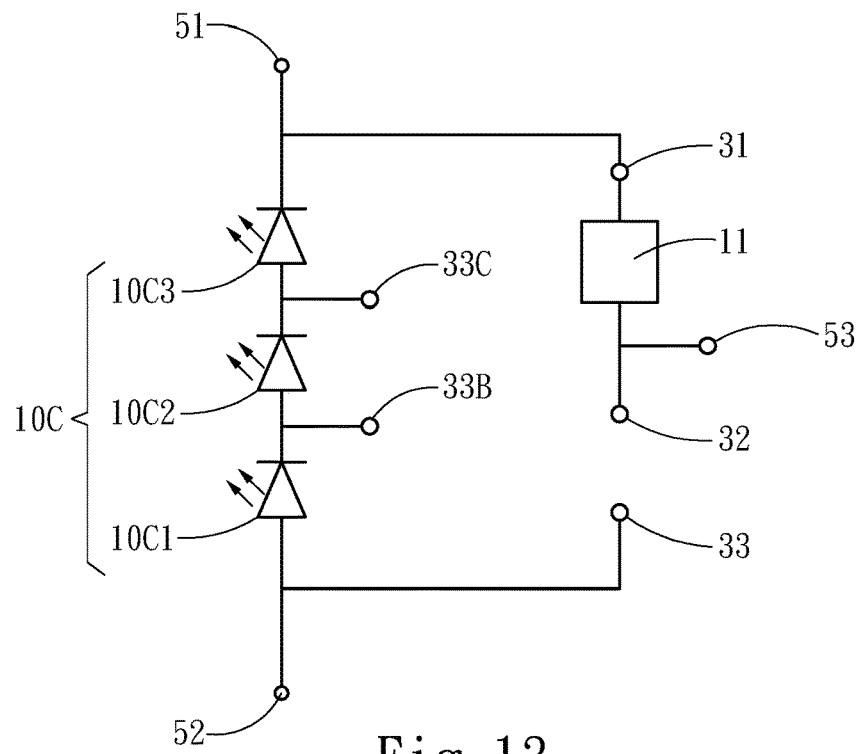
FIG. 13 is a circuit diagram of a package structure according to another embodiment of the invention.

Please refer to FIG. 13 which is a diagram of a package structure circuit according to another embodiment of the invention. In this embodiment, the main element of LED chip 10C could be a plurality of LED chips 10C1, 10C2 and 10C3 connected in series. In other embodiments, the main element of LED chip could also be a plurality of LED chips connected in parallel. In this embodiment, for example, in FIG. 13, there are three LED chips 10C1, 10C2 and 10C3 connected in series, the overall voltage (Vf) of the LED chips 10C1, 10C2 and 10C3 (the main element of LED chip 10C) is three times that of a single LED chip when operating at the same forward current of a single LED chip, and the light output is also three times that of a single LED chip. Therefore, a plurality of LED chips are commonly connected in series in a package of a headlight at present, so as to obtain higher light output with higher voltage.

However, in a series circuit, as some of the LED chips 10C1, 10C2 and 10C3 are damaged to cause leakage current, as long as one of the LED chips 10C1, 10C2 and 10C3 functions well in the series circuit, the leakage current of other damaged chips could barely be detected. In order to overcome this shortcoming, electrical test contacts 33B, 33C are added between different LED chips 10C1, 10C2, and 10C3, as shown in FIG. 13. The electrical test contacts 33B is added between the LED chips 10C1 and 10C2, and the electrical test contacts 33C is added between the LED chips 10C2 and 10C3.

As shown in FIG. 13, the characteristics of the leakage current of the LED chip 10C1 are measured by measuring the third electrical test contact 33 and the electrical test contact 33B. Similarly, the characteristics of the leakage current of the LED chip 10C2 are measured by measuring the electrical test contact 33B and the electrical test contact33C. Similarly, the characteristics of the leakage current of the LED chip 10C3 are measured by measuring the electrical test contact 33C and the first electrical test contact 31. If more LED chips are connected in series, this method can be extended in the same manner.

Figure 14:
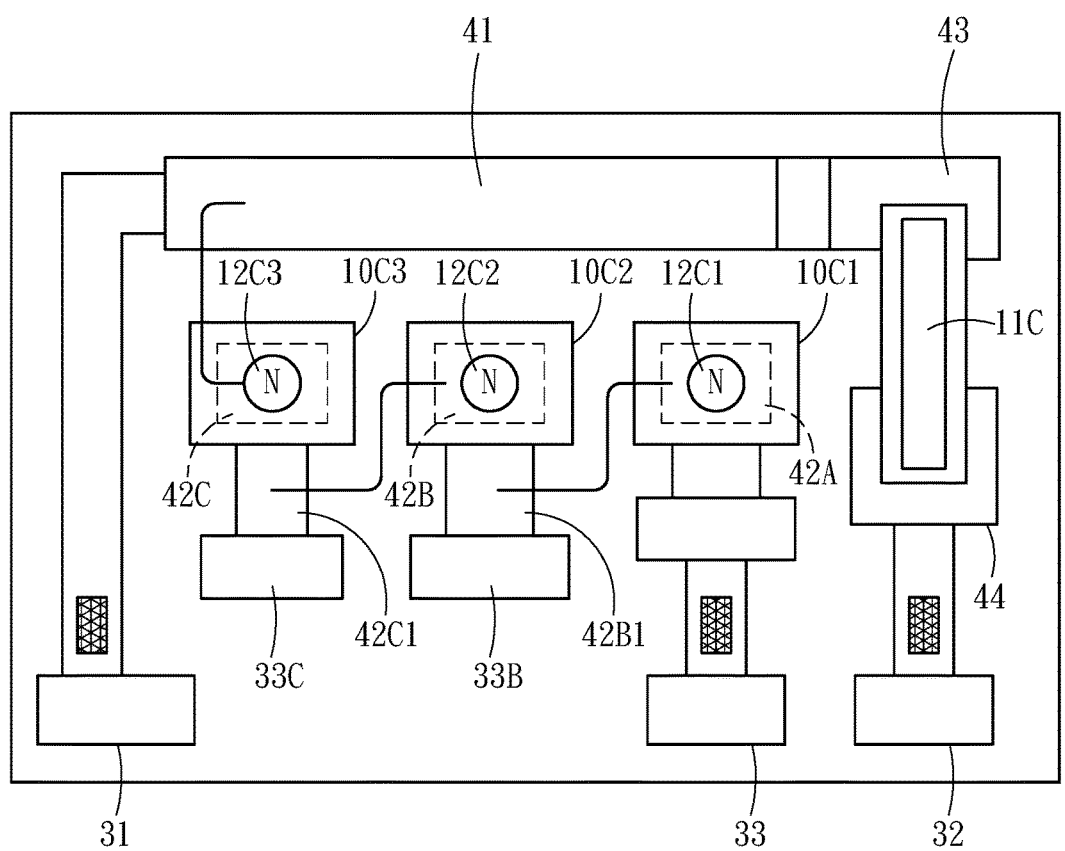
FIG. 14 is a structural diagram of a package substrate according to another embodiment of the invention.

Please refer to FIG. 14 which is a structural diagram of a package substrate according to another embodiment of the invention. In this embodiment, the LED chip 10C1 is chip-bonded to a second electrode 42A of a chip of the main element A, and a N electrode 12C1 of the LED chip 10C1 is connected to a chip-bonded base P electrode pad 42B1 of a second electrode 42B of a chip of the main element B by wire bonding. The second electrode 42B of a chip of the main element B is electrically connected to the electrical test contact 33B.

The LED chip 10C2 is chip-bonded to the second electrode 42B of the chip of the main element B, and an N electrode 12C2 of the LED chip 10C2 is connected to a chip-bonded base P electrode pad 42C1 of a second electrode 42C of a chip of the main element C by wire bonding. The second electrode 42C of a chip of the main element C is electrically connected to the electrical test contact 33C.

The LED chip 10C3 is chip-bonded to the second electrode 42C of the main element chip C, and an N electrode 12C3 of the LED chip 10C3 is connected to the electrode of the first electrode of the main element 41 by wire bonding. The first electrode of the main element 41 is connected with a second element Zener diode 11C in parallel circuit manner.

In this embodiment, the package substrate comprises five test points, including the first electrical test contact 31, the second electrical test contact 32, the third electrical test contact 33, the electrical test contact 33B, and the electrical test contact 33C to measure programmatically with five rows of probes.

As mentioned above, the invention at least comprises the following characteristics:

1. The main element of LED chip of the invention could be a horizontal LED, a flip-chip LED, a vertical LED, or a multi-conductive pillar vertical LED. A single LED chip could be adopted, or multiple LED chips could be connected in series. The application range is wide to meet the use requirements in packaging and testing.

2. The characteristics of the electrical of the main element of LED chip and the parallel circuit secondary element are measured through the first, second and third electrical test contact, which overcomes the shortcoming of the prior art that the electrical characteristics of the reverse bias (such as leakage current Ir) of the main element of LED chip are barely tested in a circuit with the parallel circuit secondary element. The invention is capable of maintaining the reliability of the main element of LED chip by screening the assemblies damaged by the defects of chip raw materials, or the mechanical force, the thermal stress, and electrostatic force in the packaging process.

3. The first, second, and third electrical test contacts could be arranged on the upper element plane or the lower SMD electrode plane of the package substrate to meet various connection modes of the test contacts.

4. Through the secondary packaging design using the first packaging material and the second packaging material, the problem that in the conventional packaging process, a wire bonding metal is be pulled by a packaging material to indirectly pull and damage the main element of LED chip, which causes micro cracks or film peeling, resulting in the performance degradation of elements and a detection failure is solved.

5. As the secondary packaging design is adopted, once an element malfunctions, the second packaging material is detached separately and the connecting wire can be removed or be open-circuit, which will barely damage the main element of LED chip, so that a retest could be conducted to find out the real cause of the element failure easily and effectively.

What is claimed is:

1. An LED package with multiple test pads and a parallel element which is used for chip bonding of a main element of LED chip and a parallel circuit secondary element, comprising:

a package substrate, wherein the package substrate is provided with an upper element plane and a lower SMD electrode plane located on two sides, the upper element plane is provided with a first electrode of the main element, a second electrode of the main element, a first electrode of the secondary element, and a second electrode of the secondary element, the first electrode of the main element and the second electrode of the main element are used for chip bonding of the main element of LED chip, the first electrode of the secondary element and the second electrode of the secondary element are used for chip bonding of the parallel circuit secondary element, and the first electrode of the main element is in electrical communication with the first electrode of the secondary element;

a first electrical test contact, wherein the first electrical test contact is disposed on the package substrate and electrically connected to the first electrode of the main element and the first electrode of the secondary element;

a second electrical test contact, wherein the second electrical test contact is disposed on the package substrate and electrically connected to the second electrode of the secondary element; and a third electrical test contact, wherein the third electrical test contact is disposed on the package substrate and electrically connected to the second electrode of the main element.

2. The LED package according to claim 1, wherein the first electrical test contact, the second electrical test contact, and the third electrical test contact are disposed on the upper element plane.

3. The LED package according to claim 2, wherein the lower SMD electrode plane is further provided with a first substrate external electrode, a second substrate external electrode, and a substrate relay electrode, the first substrate external electrode is electrically connected to the first electrode of the main element and the first electrode of the secondary element through a first electrode via hole, the second substrate external electrode is electrically connected to the second electrode of the main element through a second electrode via hole, and the substrate relay electrode is electrically connected to the second electrode of the secondary element through a substrate relay electrode via hole.

4. The LED package according to claim 2, wherein the second electrical test contact and the third electrical test contact are electrically connected through a conductive metal.

5. The LED package according to claim 4, wherein the LED package comprises a packaging material, and the packaging material covers the upper element plane of the package substrate.

6. The LED package according to claim 4, wherein the LED package comprises a first packaging material, and the first packaging material covers the main element of LED chip, the parallel circuit secondary element, the first electrode of the main element, the second electrode of the main element, the first electrode of the secondary element, and the second electrode of the secondary element.

7. The LED package according to claim 6, wherein the second electrical test contact and the third electrical test contact are electrically connected through a conductive metal.

8. The LED package according to claim 7, wherein the LED package comprises a second packaging material, and the second packaging material covers the conductive metal, the first electrical test contact, the second electrical test contact, and the third electrical test contact.

9. The LED package according to claim 1, wherein the first electrical test contact, the second electrical test contact, and the third electrical test contact are disposed on the lower SMD electrode plane.

10. The LED package according to claim 9, wherein the lower SMD electrode plane is provided with a first substrate external electrode, a second substrate external electrode, and a substrate relay electrode, the first substrate external electrode is electrically connected to the first electrode of the main element and the first electrode of the secondary element through a first electrode via hole, the second substrate external electrode is electrically connected to the second electrode of the main element through a second electrode via hole, and the substrate relay electrode is electrically connected to the second electrode of the secondary element through a substrate relay electrode via hole.

11. The LED package according to claim 10, wherein the lower SMD electrode plane of the package substrate covers a circuit board, and the second substrate external electrode and the substrate relay electrode are electrically connected by a solder paste at the lower SMD electrode plane.

12. The LED package according to claim 10, wherein the lower SMD electrode plane of the package substrate is disposed on a circuit board, and the first substrate external electrode, the second substrate external electrode and the substrate relay electrode are located at a circuit board upper plane of the circuit board, and the second substrate external electrode and the substrate relay electrode are electrically connected by a conductive thiin film at the circuit board upper plane.

13. The LED package according to claim 1, wherein the main element of LED chip is any one selected from a horizontal LED, a flip-chip LED, a vertical LED, or a multi-conductive pillar vertical LED.

14. The LED package according to claim 1, wherein the package substrate is any one selected from a ceramic substrate, a BT substrate, a copper substrate, or a silicon carbide substrate.

15. The LED package according to claim 1, wherein the main element of LED chip is a plurality of LED chips connected in series.

16. The LED package according to claim 15, wherein electrical test contacts are added between different LED chips.

17. The LED package according to claim 1, wherein the main element of LED chip is a plurality of LED chips connected in parallel circuit manner.

18. The LED package according to claim 1, wherein the parallel circuit secondary element is any one selected from a Zener diode, a capacitor, or a LED chip, and if the parallel circuit secondary element is an LED chip, a forward voltage of the parallel circuit secondary element is close to the forward voltage of the main element of LED chip.

19. The LED package according to claim 18, wherein when the parallel circuit secondary element is an unidirectional Zener diode, the parallel circuit secondary element is connected with the main element of LED chip with opposite polarity in parallel circuit manner.

* * * * *